United States Patent [19]

Parr et al.

[11] Patent Number: 5,059,485

[45] Date of Patent: Oct. 22, 1991

[54] CONDUCTIVE METALLIZATION OF SUBSTANCES WITHOUT DEVELOPING AGENTS

[75] Inventors: William J. Parr, Naperville; Paul Y. Y. Moy, Des Plaines; Dieter Frank, Naperville, all of

[73] Assignee: Akzo America Inc., New York, N.Y.

[21] Appl. No.: 437,289

[22] Filed: Nov. 16, 1989

Related U.S. Application Data

[63] Continuation-in-part of Ser. No. 204,044, Jun. 8, 1988, abandoned, which is a continuation-in-part of Ser. No. 68,593, Jun. 30, 1987, abandoned.

[51] Int. Cl.$^5$ .............................................. C23C 24/00
[52] U.S. Cl. ................................... 428/458; 427/369; 427/370; 427/123; 427/180; 427/192
[58] Field of Search ............... 427/369, 370, 123, 180, 427/192; 428/458

[56] References Cited

U.S. PATENT DOCUMENTS

| | | | |
|---|---|---|---|
| 4,382,981 | 5/1983 | Stoetzer | 427/123 |
| 4,572,843 | 2/1986 | Saito | 427/55 |
| 4,614,837 | 9/1986 | Kane | 427/96 |
| 4,663,240 | 5/1987 | Hajdu | 427/123 |
| 4,795,660 | 1/1989 | Cooray | 427/123 |

FOREIGN PATENT DOCUMENTS

| | | | |
|---|---|---|---|
| 697216 | 11/1964 | Canada | 427/192 |
| 170063 | 2/1986 | European Pat. Off. | |

*Primary Examiner*—Shrive Beck
*Assistant Examiner*—Vi Duong Dang
*Attorney, Agent, or Firm*—Shirley L. Church; David H. Vickrey; Louis A. Morris

[57] ABSTRACT

A conductive metal layer is formed on a substrate having a softening point above about 200° C. by depositing copper and nickel particles having a substantially continuous oxide coating thereon on the substrate, and heating and pressing the metal particles at a temperature of at least 200° C. Unlike similar methods wherein oxide coated metal particles are used, no developing agent is required to render the metal layer conductive. The coated substrates are useful for a variety of uses such as EMI shielding and printed circuit boards.

24 Claims, No Drawings

CONDUCTIVE METALLIZATION OF SUBSTANCES WITHOUT DEVELOPING AGENTS

RELATED APPLICATIONS

This is a continuation-in-part of Ser. No. 07/204,044, filed June 8, 1988, now abandoned, which is a continuation-in-part of Ser. No. 07/068,593, filed June 30, 1987, now abandoned.

BACKGROUND OF THE INVENTION

This invention related to the formation of a conductive layer of metal on a substrate. In particular, this invention relates to such a process wherein the conductive layer is formed from discrete metal particles of copper or nickel or combinations thereof. The invention also particularly relates to such processes wherein the metal layer is rendered conductive without the aid of a chemical agent.

It is frequently desired to form a layer of conductive metal on a (generally) non-conductive substrate. Such composites are useful for printed circuit boards, electromagnetic interference (EMI) shielding, and so forth.

Japanese publication JP110704(84) (Shin Gijutsu Kaihat) reports that a conductive layer may be formed on a substrate by spraying super fine (e.g.: 0.02 $\mu$m) metal particles with the aid of a carrier gas (e.g.: nitrogen or argon) onto a substrate, followed by low temperature (e.g.: 80° C.) sintering. One significant disadvantage of this process is the limited availability of such fine metal dust. Further, the use of met.al dust in an air spray system requires extensive hygienic safeguards Japanese publication JP66133(73) (Fujimori Kogyo) and DE2,163,118 (Fujimori Kogyo (Sakai)) both describe a process where metal particles are mixed with a binder, applied to a substrate, dried, and treated with an agent which is an acid, a halogen, or a halogenide. Such processes are inconvenient and damaging to equipment in their requirement for a binder and a corrosive agent.

GB 2,085,340 teaches a paint containing copper particles and optionally a wetting agent (preferably triethanolamine), which is useful for producing conductive coatings.

U.S. Pat. No. 4,434,084 (Dupont (Hicks)) and DE 2,411,988 (Dupont (Beske)) both describe processes wherein a mixture of copper and tin particles are coated on a substrate with the aid of chemical activators and heat sufficient to melt the tin. In the U.S. patent the chemical activators are an organic acid flux and an organic amine in an inert organic medium. In the German publication the chemical activator is a flux which may contain triethanolamine as an adjuvant.

Applicants' co-pending prior application, titled Conductive Metallization of Substrates, serial number 068,593, filed June 30, 1987 now abandoned claims a method of forming a conductive layer, which method requires the use of a chemical developing agent.

SUMMARY OF THE INVENTION

The present invention pertains to a method of forming a conductive metal layer on a substrate, consisting essentially of:
(a) a depositing step, wherein a layer of metal particles comprising copper, nickel or a combination thereof, the particles having a substantially continuous oxide coating on the surface thereof, is deposited on a substrate having a softening point such that the substrate does not deform under processing conditions at 200° C.; and
(b) a heating and pressing step of subjecting the metal particles to pressure at a temperature of at least 200° C. for a duration sufficient to improve the conductivity of the metal layer.

In another aspect, the invention is a coated substrate made by the above method.

The method of the invention is convenient to carry out, involves relatively non-corrosive materials, and produces well adhered, very conductive metal coatings on substrates.

DETAILED DESCRIPTION OF THE INVENTION

One element of the invention is the use of nickel particles, copper particles, or combinations thereof. In general, any commercially-available nickel or copper which is in the form of a powder is suitable for use in the invention. Such commercially-available powders typically have a substantially continuous oxide coating on the surface thereof.

Since the oxide coating causes the metal-particles to be non-conductive on the surface, it is necessary to remove the oxide or to disrupt the oxide surface, exposing conductive copper beneath, to achieve a conductive layer or pattern of conductive-particle to conductive-particle contact. While not critical, the use of a plate-shaped (lamellar) metal particle is preferred. However, excellent results have been obtained with spherical particles. Of more importance is the particle size of the nickel or copper particles. The principal difficulty with large particle sizes is that of obtaining a uniform distribution of particles on the substrate and ensuring adequate particle-to-particle contact in a relatively thin metal layer. Generally, the particle size will be below 30, preferably below 20, and more preferably below 10 $\mu$m.

The copper or nickel need not be particularly pure as previously stated, and typically oxides are present. Further, mixtures of copper or nickel with other metals may be used. When mixtures are used, the mixture is desirably at least 40, more desirably at least 50, preferably at least 60, and most preferably at least 70 weight % copper and/or nickel.

The metal particles are deposited on a substrate. Suitable substrates include virtually any material which is capable of being in a relatively hard, non-deformable state at processing conditions up to about 200° C. and of softening to a deformable state at higher temperatures so as to provide for adherence of the metal powder to the substrate surface. Thus, materials such as those comprising borosilicate and other low-temperature softening glass and those comprising synthetic resins are suitable, with those comprising synthetic resins being preferred Thermoplastic resins or polymers are typically employed as the synthetic resin of the present invention; metal powder is applied to the surface of a substrate comprising the resin, applying pressure to the thusly metal-covered substrate while heating the substrate to a temperature above about 200° C., such that the metal layer becomes conductive and the resin is so softened that the metal particles can be embedded into the surface of the resin, and then cooling to ambient temperature.

Suitable thermoplastic resins include polyetherimides (PEI) (Ultem ); and polyethersulfones (PES) (Victrex )

polyetheretherketone (PEEK), polyetherketone (PEK), polyarylate, polysulfone, polyarylsulfone, liquid crystalinepolymers, and thermoplastic polyimide resins. It may be noted that a common feature of such resins is a high degree of aromatic linking units. The presence of such structure commonly produces polymers which have high glass transition temperatures and flow temperatures above 200.C. In general, it is desirable to have, in the repeating units of the polymer, at least 40%, desirably at least 50%, and more desirably at least 60% of the carbon atoms being aromatic carbon atoms.

The substrates are illustratively in the form of thin (eg: 0.5 to 1 mm) sheets but other forms (eg: cubes, spheres, etc.) would be suitable. The substrates may be selected from the usual commercial grades of available materials, and no special handling or treatment is required. Although the surface to be coated should be relatively free of dirt and grease, cleaning steps are not required unless the substrate has been subjected to an unusual amount of surface contamination.

It is specifically not a requirement of the invention that the metal particles be contacted with a developing agent. However, the use of a developing agent can, in some instances, improve the conductivity or adhesion of the metal layer. Further information concerning the selection use of developing agents, as well as other relevant information, is contained in Applicants' aforementioned application, Serial No. 07/068,593, now abandoned Conductive Metallization of Substrates, which is incorporated herein by reference. In the aforementioned application the developing agents are disclosed to comprise:

(i) a long-chain aliphatic tertiary amine; (ii) a tertiary phosphine or a tertiary phosphite; or (iii) a bifunctional compound having both (1) a first atom which is a trivalent nitrogen atom or a bivalent sulfur atom and (2) at least one second atom which is nitrogen or oxygen; the first and second atoms being separated by at least two other atoms; the bifunctional compound being capable of forming a coordination complex with copper or nickel, wherein such compounds include diamines, alkanolamines, secondary amino alcohols, tertiary amino alcohols, secondary sulfides, hydrazides, hydrazones, oximes and tertiary amides.

The metal particles are deposited on the substrate by any means which will achieve a layer of particles sufficient to provide a conductive surface. A preferred method of deposition is to spray a dilute suspension (about 5-15 weight% metal) of the metal in a volatile organic solvent such as dichloromethane. For this purpose, ordinary spray equipment such as used for painting may be employed.

Another preferred method is to coat the metal particles onto a transfer plate (such as an aluminum plate, by spraying or other means, and then pressing that plate onto the surface of the substrate. The transfer plate is also preferably used as the molding plate (discussed further below). If the transfer plate has been milled or etched to form a raised pattern, then the metal particles will form the mirror image of that pattern on the substrate.

A mask can be used to form a pattern when metal is deposited by the direct spray method or the transfer plate method. Other methods of application such as roller coating, electrostatic coating, fluidized bed coating, and so forth may also be used.

It is generally necessary to induce adhesion of the metal particles to the substrate. To achieve desirable levels of adhesion of the metal, the coated substrate is desirably subjected to heat and pressure.

One function of the heat and pressure is to cause the particles to physically become embedded in the substrate. The heat required is that which is sufficient to raise the temperature of the metal particle-coated substrate to at least 200° C. for purposes of rendering the metal particles conductive, and to a temperature sufficient to cause enough softening of the substrate that the metal particles can be forced into the surface of the substrate. Obviously, the temperature at which the substrate softens will vary considerably depending on the substrate chosen. Molding temperature for a number of specific substrates are presented in the Examples. The glass transition temperature (Tg) of a substrate is a useful guide for choosing a molding temperature, but molding temperatures are typically higher than the glass transition temperature of the substrate. If the molding temperature is too low, there will be insufficient flow of the substrate and lack of adequate adhesion. If the temperature is too high, the substrate will melt and perhaps degrade Simple trial and error can easily determine the optimum molding temperature for any substrate.

Pressure is used in addition to heat to physically push the particles into the softened substrate. The precise amount of pressure is not critical, and merely needs to be sufficient to deform the metal particles to render them conductive. Typically molding pressures of about 5-100 MPa will be suitable.

The pressure may be provided by any conventional means. There is no minimum time for maintaining the pressure, except that the pressure must be maintained for a sufficient length of time to allow the substrate to reach at least 200° C., and optionally, the required molding temperature.

Whether or not heat is used to aid the adhesion of the metal to the substrate, heat is necessary to render the metal layer conductive. The temperature needed for rendering conductivity ("developing") can vary, but generally, a temperature of 200° to 400° C., preferably 220° to 350° C., and more preferably 240° to 280° C. is required The exclusion of oxygen is believed to be important to the development of the metal to a conductive state; however, the use of a press to cause the metal to adhere to the substrate will inherently exclude oxygen and result in no special means for excluding oxygen being required.

The process of the invention is subject to numerous other variations. In particular, the substrate may be a composite of several layers, with only the top layer providing for adhesion of the metal. For instance, a sheet of cured thermoset resin may be coated with a thin film of thermoplastic resin, the metal added, and then the substrate heated and pressed.

The metallized substrates of the invention are useful in a wide variety of applications including printed circuit boards, EMI shielding, capacitors, battery plates, electrical switches, and decorative panels.

The following examples are set forth to further explain the invention. Surface resistivity data presented in the examples is expressed in ohms per square. A description of surface resistivity and techniques for measurement can be found in ASTM D 257-78 (Reapproved 1983).

EXAMPLE 1

The following data illustrates the principle that commercially-available copper powders have an oxide coating on the surface thereof which renders the copper powder nonconductive.

The copper powder used in the examples which follow was grade 22BB400 obtained from POUDMET in France. This is a commercial flake form with 98% by weight being smaller than 40 microns, and having a specific area of 3,400 cm$^2$/g.

(1) Untreated Poudmet 22BB400 copper flake was slurried in CH2ClCH2Cl and coated onto PEI film. The surface resistance of this coating layer was greater than 10$^6$ ohms/square.

(2) Untreated Poudmet 22BB400 copper flake was subjected to treatment with hydrogen in an autoclave at 220°–250° C/20–40 psi (as described in U.S. Pat. No. 4,614,837 to Kane et al., issued September 30, 1986, to remove oxide layers which may coat the flake/particle) until no further hydrogen uptake was observed.

(3) The treated copper flake from (2) was slurry coated onto PEI film, as described in (1) and had a surface resistance of 0.6 ohms/square.

This shows that hydrogen treatment to remove oxide layers which coat the surface of the flake or particle renders the particle conductive. Thus, the non-conductivity of the particles prior to treatment is attributed to the presence of such oxide layers.

(4) The slurry coated samples of (3) were placed in an air oven at 71° C. and the surface resistance was assessed at intervals.

| | |
|---|---|
| 0 hours | 0.6 ohms/square |
| 24 hours | 1.7 ohms/square |
| 72 hours | 3.0 ohms/square |
| 192 hours | 20.0 ohms/square |

Thus, the layer of flakes was reoxidizing with time, with an accompanying increase in resistance Of course, free flakes which are contacted with oxygen (in a manner not controlled by diffusion rate to the same extent as the coated layer described above) would be expected to oxidize much more rapidly, and a layer of flakes subsequently processed to embed the layer in a thermoplastic would be expected to oxidize much more slowly if at all.

According the the present invention, it is possible to use oxide-coated metal particles of copper and/or nickel without the need for a step such as this hydrogen treatment to remove the oxide coating from the metal particles.

EXAMPLE 2

Comparative

This data illustrates that for substrates not within the scope of the invention (those which soften below 200° C.), good (high) conductivity, can be achieved only in the presence of a suitable developing agent.

Part A: A performed plaque of high-impact polystyrene (HIPS) about 3"×4"×0.03" thick (76×102×0.76 mm) was sprayed with a suspension of copper powder in dichloromethane and dried in an oven at 55° C. (to evaporate the solvent completely). The copper applied weighed about 0.3 g and exhibited slight adhesion to the plastic as a result of solvent swelling of the surface during spray up. The coated preform could thus be manipulated without the coating falling off, but if the coating was rubbed the copper became detached. At this stage surface resistance of the coating was greater than 10$^7$ ohms/square. The coated preform was then compression molded between chromed steel plates at 215° C. for 12 min under 5 tons/square inch (69 MPa) pressure. The molds were cooled in a second press at 20° C. and the plastic removed. The copper powder had become compressed into the surface of the plastic (since the molding was done at above the temperature at which the polymer became fluid) to form a well adhered continuous copper layer. This layer was orange in color and had a surface resistance of greater than 10$^6$ ohms/square.

Part B: a HIPS preform was sprayed with copper powder as in Part A, dried, and then sprayed with a 5% solution of N,N-bis(2-hydroxyethyl)cocoamine (a developing agent) in dichloromethane so as to afford a 3:1 weight ratio of Cu:amine after drying in an oven at 55° C. to evaporate the solvent. The coated preform was compression molded as in Example 2A. After development the well-adhered copper coating was pink in color and possessed a surface resistance of 0.01 ohms/square. The use of the developing agent thus improved the conductivity by a factor of 10$^8$.

EXAMPLE 3

A. Preforms were prepared from polyethersulfone (Victrex 4100P, ICI) by molding at 240° C. Attempts to incorporate N,N bis(2-hydroxyethyl)tallow amine (a developing agent) into the PES by extrusion resulted in non-homogenous, somewhat brittle, samples.

B. A series of PES preforms 4"×4"×0.03" were sprayed with a suspension of copper powder in dichloromethane to give a weight gain of about 0.25 g of copper after solvent evaporation. The preforms were compression molded at various temperatures between 150° C. and 250° C. for 10 min at 5 tpsi (69 MPa) pressure. After cooling, the copper layers were examined for conductivity by the four-probe method, and for adhesion by means of tape attached to the metal surface. Following this the samples were cut in half and one half sprayed with a solution of N,N-bis(2-hydroxyethyl)tallowamine in dichloromethane to give Cu:amine ratios of around 2:1 to 4:1 and then molded a further 10 min. After cooling the conductivity and adhesion were reassessed. Below 220° C. adhesion of the copper layer was generally poor due to non-flow of the PES, and the copper could easily be scratched away. At 200°–220° C. there was some evidence which indicated that treatment with the amine improved the adhesion of the copper. Above 220° C. adhesion of the copper coatings was much improved, particularly in the presence of developer, due to good flow of the PES. Use of the amine in samples molded at below 220° C. led to copper layers exhibiting enhanced conductivity (below 0.1 ohms/square) but of insufficient adhesion. Of particular interest however, was the observation that at temperatures above 200° C., copper powder sprayed onto PES polymer produced copper layers of high conductivity, having a surface resistance of 0.03 to 0.08 ohms/square, in the absence of a developing agent.

C. PES pellets were subjected to solvent extraction in a Soxhlet apparatus for seven days using a mixture of xylene and chloroform (90:10), and then pressed into preforms. These were sprayed with copper powder, and in some cases also with N,N-bis(2-hydroxyethyl)tallowamine developer and compression molded at 220°

C. No difference in conductivity of the copper layer with or without the amine was observed (0.01 ohm/square) but use of developer enhanced the adhesion of the copper to the PES. These results indicate that the reason for the ability of PES to afford highly conductive layers of copper, when sprayed with copper powder and compression molded, is probably not due to the presence of polymerization catalyst residues or of phosphorus containing antioxidants.

D. PEI pellets were solvent extracted as in (C) and molded into preforms. The PEI preforms were sprayed with a suspension of copper powder and compression molded 10 min. at 5 tpsi (69 MPa) pressure at various temperatures. It was observed that solvent extraction did not prevent PEI from affording conductive copper layers, having a surface resistance of 0.095 to 0.11 ohms/square, in the absence of a developer when sprayed with copper powder and molded at 220.C. It may be noted that use of an N,N-bis(2-hydroxyethyl) tallowamine developer at 220° C. and above improved the adhesion of the copper layer.

E. PEI preforms were sprayed with a suspension of nickel powder (Alcan 756) in tetrahydrofuran and dried After being compression molded for 10 min at 230° C. under 5 tpsi (69 MPa) pressure, and cooled the preform was found to bear a grey layer of nickel which exhibited high conductivity (a surface resistance of 0.15 ohms/square) in many areas. When similar experiments were carried out at 180° C. adhesion of the nickel to PEI was inadequate. These results indicate that the attainment of highly conductive nickel coatings upon PEI do not necessarily require the use of a developer.

EXAMPLE 4

The following examples illustrate the principle of transfer molding as applied to the process of the invention.

A. A ¼" (6.3 mm) thick aluminum block was milled to produce a positive image of the circuit pattern required for a simple circuit based on the NE555 timer integrated circuit upon the raised portions. This pattern piece was sprayed with a suspension of copper powder in dichloromethane and then compression molded in contact with a 0.03" (0.76 mm) thick piece of polyetherimide for 10 min at 220° C. under 5 tpsi (69 MPa). By filling the hollow areas of the aluminum pattern piece with a Viton rubber filler of the appropriate thickness, the PEI remained relatively flat after the transfer molding.

Upon cooling it was found that the copper powder had transferred from the aluminum to the surface of the PEI to form an orange circuit pattern. Corner to corner resistance over 5" (127 mm) or so of 3/16" (4.8 mm) wide track was around 100–200 ohms using 2 ohmmeter probes. Better adhesion of the metal (due to improved PEI fluidity) was obtained by molding at 240° C. but this produced some "flashing" (ie: oozing of the resin out of the mold).

B. A 0.03" (0.76 mm) thick piece of polyetherimide which bore a circuit pattern formed by transfer molding of copper from an aluminum pattern in the absence of developer at 200° C. and possessing a resistance of 6 ohms over a 3" (76 mm) length of
⅛" (3.2 mm) wide copper track using 2-probes was placed in an evacuated tube containing 6 drops of N,N-bis(2-hydroxyethyl) cocoamine and the tube placed in an oven for 30 min at 200° C. After cooling the resistance of the same track measured over th same distance had been reduced to 0.1 ohm/square and the color of the copper changed from orange to pink. This indicates the process of the present invention can be combined with a subsequent step wherein the circuit pattern is treated with a developer to improve conductivity. This two-step procedure avoids the need for incorporation of the developer into the substrate material, avoiding substrate mechanical property performance reduction of the type observed in Example 3A.

Only a limited number of preferred embodiments of the invention have been described above. However, one skilled in the art will recognize the numerous substitutions, modifications and alterations which can be made without departing from the spirit and scope of the invention as limited by the following claims.

We claim:

1. A method of forming a conductive metal layer on a substrate, consisting essentially of:
   (a) a depositing step, wherein a layer of metal particles comprising copper, nickel or a combination thereof, said particles having a substantially continuous oxide coating on the surface thereof, is deposited on a substrate having a softening point such that said substrate does not deform under processing conditions at 200° C. and
   (b) a heating and pressing step of subjecting metal particles to pressure at a temperature of at least 200° C. for a duration sufficient to improve the conductivity of said metal layer.

2. The method of claim 1 wherein said depositing step comprises spraying said metal particles onto said substrate.

3. The method of claim 2 wherein said spraying is done with the aid of a liquid suspension agent.

4. The method of claim 3 wherein said liquid suspension agent is an organic solvent.

5. The method of claim 1 wherein said copper, nickel or combinations thereof contains less than about 40 weight % of non-conductive layer forming metals.

6. The method of claim 1 wherein said copper, nickel or combinations thereof contains less than about 20 weight % of non-conductive layer forming metals.

7. The method of claim 1 wherein said metal particles have a number average particle size of less than about 30 μm.

8. The method of claim 1 wherein said metals are present in the form of a mixture containing less than about 25 weight of other non-conductive layer forming metals.

9. The method of claim 1 wherein said metal particles are in the form of flakes.

10. The method of claim 1 wherein said heating and pressing step takes place at 200° C. to about 400° C.

11. The method of claim 10 wherein said heating and pressing step takes place at about 220° to about 350° C.

12. The method of claim 1 wherein said heating and pressing step takes place at temperature below the melting point of any substantially present metal.

13. The method of claim 12 wherein the pressure is 5–100 MPa.

14. The method of claim 1 wherein the maximum temperature in said heating and pressing step is at or above the softening point of said substrate.

15. The method of claim 1 wherein said substrate is comprised of a synthetic resin.

16. The method of claim 15 wherein said synthetic resin is a thermoplastic resin wherein, in the repeating units of the polymer, at least 40% of the carbon atoms are aromatic carbon atoms.

17. The method of claim 16 wherein said resin is a polyether sulfone, a polyetherimide, a polyetheretherketone (PEEK), a polyetherketone (PEK), polyarylate, a polysulfone, a polyarylsulfone, a liquid crystaline polymer, or a thermoplastic polyimide resin.

18. The method of claim 1 wherein said depositing step comprises applying said metal particles to a transfer surface and pressing the transfer surface against said substrate.

19. The method of claim 18 wherein said transfer surface has relief areas which will not contact the substrate, thereby transferring a pattern of metal particles 20. The method of claim 1 wherein a metal layer has been deposited on two opposite surfaces of the substrate.

21. A coated substrate produced by the method of claim 1.

22. A coated substrate produced by the method of claim 20.

23. A method of shielding a space from a source of EMI, comprising placing the coated substrate of claim 21 between the source of EMI and the space to be shielded.

24. A method of shielding a space from a source of EMI comprising placing the coated substrate of claim 22 between the source of EMI and the space to be shielded.

* * * * *